United States Patent [19]

Criss et al.

[11] Patent Number: 4,563,400

[45] Date of Patent: Jan. 7, 1986

[54] PRIMER FOR METAL FILMS ON NONMETALLIC SUBSTRATES

[75] Inventors: Russell C. Criss, Pittsburgh; F. Howard Gillery, Allison Park, both of Pa.

[73] Assignee: PPG Industries, Inc., Pittsburgh, Pa.

[21] Appl. No.: 702,977

[22] Filed: Feb. 19, 1985

Related U.S. Application Data

[62] Division of Ser. No. 530,553, Sep. 9, 1983, Pat. No. 4,512,863.

[51] Int. Cl.$^4$ ............................................. C03C 27/02
[52] U.S. Cl. ............................. 428/630; 204/192 R; 427/89; 428/638
[58] Field of Search ............................... 428/630, 638

[56] References Cited

U.S. PATENT DOCUMENTS

| | | | |
|---|---|---|---|
| 3,386,906 | 6/1968 | Bronnes | 204/192 |
| 3,393,446 | 7/1968 | Hughes et al. | 29/492 |
| 3,437,888 | 4/1969 | Hall | 317/234 |
| 3,457,138 | 7/1969 | Miller | 161/196 |
| 3,702,808 | 11/1972 | Smith et al. | 428/630 |
| 3,922,385 | 11/1975 | Konantz et al. | 204/192 |
| 3,986,944 | 10/1976 | Gould | 204/192 |
| 4,017,661 | 4/1977 | Gillery | 428/412 |
| 4,094,763 | 6/1978 | Gillery et al. | 204/192 P |
| 4,166,018 | 8/1979 | Chapin | 204/192 P |
| 4,342,632 | 8/1982 | Heim et al. | 204/192 |
| 4,404,235 | 9/1983 | Tarng et al. | 427/89 |
| 4,416,916 | 11/1983 | Aykan et al. | 428/630 |

*Primary Examiner*—Veronica O'Keefe
*Attorney, Agent, or Firm*—Donna L. Seidel

[57] ABSTRACT

A method is disclosed for improving the adhesion of sputtered metal films such as silver and copper by means of first depositing a primer layer of a metal such as stainless steel.

9 Claims, No Drawings

PRIMER FOR METAL FILMS ON NONMETALLIC SUBSTRATES

This application is a division of U.S. Application Ser. No. 530,553 filed Sept. 9, 1983 by the same inventors, now U.S. Pat. No. 4,512,863.

BACKGROUND OF THE INVENTION

The present invention relates generally to the art of sputtering transparent metallic films for solar energy control, and more particularly to the art of controlling the color and adhesion of sputtered films.

Transparent films of metals such as silver, copper, nickel and cobalt are readily produced by electroless deposition methods. U.S. Pat. No. 3,457,138 to Miller discloses an electroless (wet chemical) method for producing transparent copper films over a thin transparent silver film on glass. Similarly produced wet chemical silver/copper films on glass have achieved commercial success as architectural products for solar energy control. The coating effectively reflects solar heat energy while presenting an aesthetically appealing low reflectance pinkish colored surface to the observer.

However, advances in coating technology provide alternative processes for producing transparent metallic films for solar energy control, such as chemical vapor deposition, vacuum evaporation deposition, and cathode sputtering. Cathode sputtering is particularly desirable for producing metallic films in a method that is fast and efficient on a large scale. U.S. Pat. No. 4,166,018 to Chapin discloses a particularly useful sputtering process and apparatus which employ a magnetic field to improve cathode sputtering conditions. A sputtering apparatus is described in which a magnetic field is formed adjacent a planar sputtering surface. The field comprises arching lines of flux over a closed loop erosion region of the cathode surface.

In attempting to reproduce the properties of a wet chemical two-layer silver/copper film on glass by cathode sputtering, it was discovered that, using known cathode sputtering techniques to produce two-layer silver/copper films at various thicknesses and thickness ratios, the desirable low reflectance pinkish colored appearance of the wet chemical two-layer silver/copper film is not obtained. Rather, typical sputtering conditions result in two-layer silver/copper films that range in appearance from highly reflective bright silver to highly reflective bright copper depending on the silver/copper ratio and the orientation of the sample.

U.S. Pat. No. 4,462,884 to Gillery et al entitled "Low Reflectance, Low Emissivity Sputtered Films" discloses a method for producing transparent two-layer silver/copper films having a low reflectance pinkish colored appearance by cathode sputtering. The method disclosed therein requires the deposition of a first layer of silver in a discontinuous agglomerated state. The deposition of a continuous copper film over the discontinuous agglomerated silver film produces the desired low reflectance pinkish colored appearance characteristic of the wet chemical product. The deposition of silver in a discontinuous agglomerated state by cathode sputtering requires conditions which allow the silver arriving at the substrate surface sufficient time to agglomerate. This can be accomplished by either slowing the arrival rate of silver or increasing its mobility at the substrate surface. Slowing the arrival rate of the sputtered silver may be achieved by either lowering the power applied to the sputtering cathode or by increasing the gas pressure in the vacuum chamber in which the sputtering process is being performed. Increasing the mobility of the silver may be achieved by raising the temperature or decreasing the surface energy of the substrate.

Unfortunately, the discontinuous silver layer applied by cathode sputtering as described above does not have as good adhesion to glass as is desired for a commercial window unit. Moreover, the degree of agglomeration of the silver is difficult to control. The deposition of the silver layer is affected by the condition of the glass surface and the method used to clean it. The color and adhesion of a dual layer coating of silver and copper are particularly difficult to optimize if the glass substrate has been in storage and has stain or incipient stain on the surface to be coated.

SUMMARY OF THE INVENTION

The present invention provides a method for achieving improved adhesion and color control of a sputtered film of a metal such as silver or copper by means of a primer layer of a metal such as stainless steel. The sputtering of a stainless steel primer layer is particularly useful in the production of a desirable silver/copper two-layer sputtered film on glass. The stainless steel primer layer may be sputtered onto a substrate surface to a thickness on the order of an atomic layer to provide a suitable surface for the sputtering of more sensitive metals such as silver. Thicker primer layers are also useful, limited only by the desired final transmittance of the coated article.

DESCRIPTION OF THE PREFERRED EMBODIMENTS

Nonmetallic substrates, preferably transparent substrates such as glass, are coated with various metal and metal oxide films by cathode sputtering. The adhesion of some metallic films, notably silver, is not as good as is desired in a commercial product. In addition, the sputtered film may contain off-color spots, associated with the surface quality of the substrate, which render the product commercially unacceptable.

In accordance with the present invention, the film adhesion and substrate surface quality problems of the prior art are solved by means of a primer layer of an adherent, stable metal composition which bonds oxidatively to the substrate surface, such as stainless steel, chromium or titanium. Preferably, a stainless steel cathode is installed in a sputtering chamber. A clean transparent substrate is coated with a very thin primer layer of stainless steel prior to the deposition of other metals which do not adhere as well such as gold, silver and/or copper. An extremely thin layer of stainless steel, an essentially elemental layer only a few Angstroms thick, is sufficient to provide the desired adhesion and stability. Thicker primer layers are also useful, limited in thickness only by the desired transmittance of the final coated article.

In a particularly preferred embodiment, glass substrates to be coated with a two-layer silver/copper film by cathode sputtering are first coated with a stainless steel primer layer. The glass substrates are preferably first washed in a conventional washing operation to remove any accumulated dirt and debris. The glass may be of any composition, but soda-lime-silica float glass is preferred. Typical float glass substrates have a transmittance of about 90 percent in the visible wavelength range. A clean glass substrate is placed in a sputtering chamber equipped with a stainless steel cathode. Sputtering is carried out to form a very thin primer layer of stainless steel on the glass surface. The thickness of the stainless steel primer layer may be as little as a few Angstroms, essentially an elemental layer, which decreases the transmittance by only about 1 to 2 percent. Such a stainless steel primer layer is sufficient to produce the desired adhesion and stability of subsequently sputtered films.

In a most preferred embodiment, wherein a two-layer film of silver and copper is to be sputtered, it is noted that a discontinuous silver film is not produced at useful thicknesses when silver is sputtered onto the stainless steel primer layer. As a result of the formation of a continuous silver layer, the resultant coated article may have a more highly reflective appearance and a more silvery or coppery color than is desired. In accordance with the present invention, a desired low reflectance pinkish colored silver/copper coating can be formed by increasing the thickness of the stainless steel primer layer, typically to about 20 to 25 Angstroms. If the thicker primer layer produces a lower reflectance than is desired, the reflectance can be raised by increasing the amount of silver relative to the amount of copper in the overlying two-layer film. The silver/copper two-layer films of the present invention may be stabilized by treatment with passivating agents.

While the present invention is described in detail with regard to a stainless steel primer layer on glass and an overlying silver/copper coating deposited by cathode sputtering, various other embodiments are included within the scope of the invention. Other primer metals may include chromium, titanium, vanadium, aluminum, tin, tantalum and nickel alloys such as Inconel. In addition to silver and copper, other sputtered metals such as gold, platinum and palladium may benefit from the primer layers of the present invention. Nonmetallic substrates other than glass may be coated and need not be transparent. The present invention will be further understood from the descriptions of specific examples which follow.

EXAMPLES

Clear float glass sheets measuring 3 by 2 feet (91 by 61 centimeters) and 6 millimeters thick are washed in a conventional washer. The transmission of the clear glass measured at 550 nanometers is about 90 percent. Clean glass sheets are coated using an in-line coating facility available from Airco-Temescal. The coater is a semi-continuous architectural coating facility capable of coating glass in sizes up to 7 by 12 feet (2.1 by 3.7 meters) on a conveyor while employing up to nine stationary cathodes which are 13 by 106 inches (0.3 by 2.7 meters). Adjacent the planar sputtering surfaces is created a magnetic field comprising curved lines of magnetic flux which form a closed loop erosion region on the sputtering surface. This erosion region has a slightly irregular "oval racetrack" shape.

Stainless steel, silver and copper cathodes are installed in the coater in sequence. Each cathode is powered by a standard 120 kilowatt power supply operating under power control at various percentages of the rated power. The speed of the conveyor and number of cathodes may be varied to obtain the desired film thickness. The atmosphere in the sputtering chamber is argon at a pressure of 3 millitorr. In this example, the line speed is about 80 inches (about 2 meters) per minute for a single pass under stainless steel, silver and copper cathodes in sequence. A transmission photometer which reads luminous transmission is installed on-line to monitor the transmission of the film after each stage of coating.

A glass substrate is conveyed under the stainless steel cathode, which comprises 19 percent chromium, 9 percent nickel, no more than 0.08 percent carbon and the balance iron, at an applied voltage of 360 volts. A stainless steel primer layer is sputtered onto the glass surface, decreasing the transmittance from about 90 percent to about 74 percent, corresponding to a stainless steel primer layer thickness of about 24 Angstroms. The stainless steel primer coated glass is then conveyed under the silver cathode. A continuous silver layer is sputtered, at an applied voltage of 331 volts, over the stainless steel primer layer, decreasing the transmittance of the coated glass to about 63 percent, corresponding to a silver layer thickness of about 22 Angstroms. Finally, the silver coated, stainless steel primed glass is conveyed under the copper cathode, at an applied voltage of 423 volts, sputtering a layer of copper over the silver layer, decreasing the transmittance to about 16 percent, corresponding to a copper layer thickness of about 257 Angstroms.

Although a much thinner stainless steel layer, one that decreases the transmittance by only 1 to 2 percent, is effective to improve the adhesion of the silver layer, the stainless steel primer layer of this example, in combination with preferred silver and copper layer thicknesses, duplicates a desired low reflectance pinkish colored appearance. The final coated article has a luminous reflectance of about 34 percent and chromaticity coordinates of $x=0.3478$ and $y=0.3333$ with respect to Illuminant D-65. The improved adhesion of the silver/copper film with the stainless steel primer is evaluated by means of a tape test wherein an adhesive tape (Scotch ® brand transparent tape) is pressed against the coating and then removed. Without the primer, essentially all of the silver/copper film is removed with the tape. However, when the silver/copper film is sputtered over a primer layer in accordance with the present invention, as in this example, none of the film is removed with the tape.

The above example is offered to illustrate the present invention. Various modifications, such as the use of other primer metals such as titanium, chromium, vanadium, aluminum, tin, tantalum and nickel alloys such as Inconel, as well as the sputtering of other sensitive metals such as gold, platinum and palladium, are included within the scope of the present invention, which is defined by the following claims.

We claim:
1. An article of manufacture comprising:
   a. a nonmetallic substrate capable of oxidative bonding with a metal primer layer;
   b. a primer layer of a metal which bonds oxidatively with the substrate surface; and
   c. a coating of a metal selected from the group consisting of silver, copper, gold, platinum, palladium and mixtures thereof deposited on said primer layer.
2. An article according to claim 1, wherein the substrate, the primer layer and the coating are all transparent.
3. An article according to claim 2, wherein the substrate is glass.
4. An article according to claim 1, wherein the primer layer comprises a metal selected from the group consist- ing of stainless steel, chromium, titanium, vanadium, aluminum, tin, tantalum, nickel and alloys thereof.

5. An article according to claim 4, wherein the primer layer is stainless steel.

6. An article according to claim 9, wherein the thickness of the primer layer is about 20 to 25 Angstroms.

7. An article according to claim 5, wherein the coating comprises a layer of silver.

8. An article according to claim 7, which further comprises a layer of copper over the layer of silver.

9. An article according to claim 8, wherein the stainless steel, silver and copper layers are of relative thicknesses which produce a low reflectance, pinkish colored article.

* * * * *